United States Patent [19]

Miyachi et al.

[11] Patent Number: 5,834,326
[45] Date of Patent: Nov. 10, 1998

[54] PROCESS FOR PRODUCING A LUMINOUS ELEMENT OF GROUP III NITRIDE SEMI-CONDUCTOR

[75] Inventors: Mamoru Miyachi; Toshiyuki Tanaka; Yoshinori Kimura; Hirokazu Takahashi; Hitoshi Sato; Atsushi Watanabe; Hiroyuki Ota, all of Trusugashima; Isamu Akasaki; Hiroshi Amano, both of Nagoya, all of Japan

[73] Assignee: Pioneer Electronic Corporation, Tokyo, Japan

[21] Appl. No.: 763,779

[22] Filed: Dec. 11, 1996

[30] Foreign Application Priority Data

Dec. 12, 1995 [JP] Japan ........................ 7-322992

[51] Int. Cl.⁶ ................................................ H01L 21/00
[52] U.S. Cl. .................. 438/29; 438/46; 438/509; 438/796; 148/DIG. 65; 148/DIG. 113
[58] Field of Search ........................ 438/29, 46, 509, 438/796; 148/DIG. 65, DIG. 113

[56] References Cited

U.S. PATENT DOCUMENTS

| 4,868,614 | 9/1989 | Yamazaki | 357/17 |
|---|---|---|---|
| 5,239,188 | 8/1993 | Takeuchi et al. | 257/76 |
| 5,389,571 | 2/1995 | Takeuchi et al. | 437/133 |
| 5,496,766 | 3/1996 | Amano et al | 437/127 |

FOREIGN PATENT DOCUMENTS

| 402257679A | 10/1990 | Japan . |
|---|---|---|
| 5-183189 | 7/1993 | Japan . |
| 407273366A | 10/1995 | Japan . |
| 409162442A | 6/1997 | Japan . |

OTHER PUBLICATIONS

Amano et al., "P–Type Conduction in Mg–Doped GaN Treated with Low–Energy Electron Beam Irradiation (LEEBI)", Japanese Journal of Applied Physics, vol. 28, No. 12, pp. L2112–L2114, Dec. 1989.

Nakamura et al., "Thermal Annealing Effects on P–Type Mg–Doped GaN Films," Japanese Journal of Applied Physics, vol. 31, pp. L139–142, Feb. 1992.

Khan et al., "Violet–blue GaN homojunction light emitting diodes with rapid thermal annealed p–type layers", Appl. Phys. Lett. 66, pp. 2046–2047, Apr. 17, 1995.

*Primary Examiner*—John Niebling
*Assistant Examiner*—Long Pham
*Attorney, Agent, or Firm*—Finnegan, Henderson, Farabow, Garrett & Dunner, L.L.P.

[57] ABSTRACT

A process for producing a semiconductor emitting device of group III nitride semiconductor having a crystal layer $(Al_xGa_{1-x})_{1-y}In_yN$ ($0 \leq x \leq 1$, $0 \leq y \leq 1$) includes; a step of forming at least one pn-junction or pin-junction and a crystal layer $(Al_xGa_{1-x})_{1-y}In_yN$ ($0 \leq x \leq 1$, $0 \leq y \leq 1$) to which a group II element is added; and a step of forming electrodes on the crystal layer. The process further includes an electric-field-assisted annealing treatment in which the pn-junction or pin-junction is heated to the predetermined temperature range while forming and maintaining an electric field across the pn-junction or pin-junction for at least partial time period of the predetermined temperature range via the electrodes.

13 Claims, 15 Drawing Sheets

PROCESS FOR PRODUCING A LUMINOUS ELEMENT OF GROUP III NITRIDE SEMICONDUCTOR

BACKGROUND OF THE INVENTION

1. Field of the Invention

The present invention relates to a group III nitride semiconductor device (also referred to herein as a device) and, particularly to a process for producing the same.

2. Description of the Related Art

In the art of a luminous device such as a light emitting diode, a semiconductor laser diode or the like, there is known a luminous device or opto-electronic device comprising a crystal layer including a single crystal of group III nitride semiconductor $(Al_xGa_{1-x})_{1-y}In_yN$ to which group II elements such as magnesium (Mg), zinc (Zn) or the like are added, which is attracted as a wide gap semiconductor expected to be a material for a device for being capable of emitting a blue light.

A group III nitride crystal made of aluminum (Al), gallium (Ga), indium (In) and nitrogen (N) $[(Al_xGa_{1-x})_{1-y}In_yN \ (0 \leq x \leq 1, 0 \leq y \leq 1)]$ to which group II elements such as Mg, Zn or the like are added is produced by a chemical vapor deposition. This so-called group II added group III nitride as it is immediately after growth has a high resistance. In addition, the as grown group II added group III nitride does not have a proper emitting property of blue light or ultraviolet (UV) radiation. Therefore, if a blue light emitting diode is produced, there is known as its emitting property being no good.

Recently, a reforming method have been reported that a high resistance $(Al_xGa_{1-x})_{1-y}In_yN \ (0 \leq x \leq 1, 0 \leq y \leq 1)$ crystal to which Mg or Zn is added is reformed to a low-resistivity p-type crystal by means of a specific treatment. H. Amano et al. discloses that a low-resistivity p-type crystal is achieved by performing a low energy electron beam irradiation treatment to such a crystal (H. Amano, M. Kito, K. Hiramatsu and I. Akasaki, Jpn. J. Appl. phys. Vol. 28, 1989, pp-L2112–L2114). Further, S. Nakamura et al. also discloses that a low-resistivity p-type crystal is achieved by performing a thermal annealing treatment under a pressurized or atmospheric pressure in an atmosphere of nitrogen to such a crystal (S. Nakamura, T. Mukai, M. Senoh, N. Iwasa, Jpn. J. Appl. Phys. Vol. 31, 1992, pp-L139–L142).

The mechanism of the treatment for establishing the p-type layer is interpreted as there are dissociation and elimination of atomic hydrogens due to the above treatment, the hydrogens being combined to the group II acceptor impurities such as Mg or the like in the layer formation and neutralizing the acceptors.

The low energy electron beam irradiation treatment causes an increase of a blue light emitting intensity of the device and is an excellent reforming-treatment method for achieving a low-resistivity crystal. However, the treated depth is restricted by the penetration depth of the electron beam. In the case that the accelerating voltage for electrons of from 6 kV to 30 kV is used, the treated depth is approximately 0.5 micrometers from the surface of GaN film. Although the increase of the accelerating voltage for electrons enlarges the penetration depth, the electrons may damage the crystal structure. Therefore, it is difficult to apply such a treatment to the manufacture of the emitting device. In addition, the electron beam is scanned on the surface of the wafer one by one in the low energy electron beam irradiation treatment, so that the increase of the treatment time per one wafer causes faulty in the mass production of the device.

On the other hand, said thermal annealing treatment is equal in the p-type establishment to the low energy electron beam irradiation treatment and does not restrict any treated depth caused by the penetration depth of the electron beam. Furthermore, the thermal annealing treatment is advantageous in the mass production of the device, since a plurality of the wafers can be introduced into a heating furnace to be performed the annealing process. There is however a drawback in the thermal annealing treatment. When turning the attention to the p-type establishment, namely the electronic properties or mechanism, it is preferable that the treating temperature is set a high temperature as described in Nakamura et. al. (S. Nakamura, T. Mukai, M. Senou and N. Iwasa, Jpn. J. Appl. Phys. Vol. 31, 1992, pp-L139–L142). The elevation of temperature for the thermal annealing treatment causes, however, the deterioration of the emitting characteristic of the crystal layer. This is interpreted as vacant holes of nitrogen occur in the crystal layer caused by the superheating. When the emitting device with a short wavelength formed by using the material $(Al_xGa_{1-x})_{1-y}In_yN$ $(0 \leq x \leq 1, 0 \leq y \leq 1)$, the equilibrium nitrogen dissociation pressure for a main component of binary GaN is 100 atms at 1100° C. This dissociation pressure is undue high. Such a high pressure thermal annealing treatment for the p-type establishment promotes an easy dissociation of nitrogen in the layer to eliminate it outside.

To avoid this deterioration, it is possible to perform the following manners (a) to (c):

(a) The nitrogen pressure in atmosphere is set at more than said dissociation pressure during the thermal annealing treatment, (b) After forming a protective layer with hydrogen-permeability without nitrogen-permeability on the surface of the crystal layer, the thermal annealing treatment is performed (Japanese Patent application No. 3-321353), and (c) At an undue high temperature e.g., 1150° C. in the thermal annealing treatment, the treating period is remarkably shortened e.g., 30 seconds (M. Asif Kahn, Q. Chen, R. A. Skogman, and J. N. Kuznia, Appl. Phys. Lett. Vol. 66, 1995, pp2046–pp2047).

In case of (a), the nitrogen pressure necessitates more than several tens atms or more, so that the productivity is reduced. In case of (b), the cap layer should be made of any one of GaAlN, AlN, $Si_3N_4$ and $SiO_2$ as described in claim 4 of the Japanese Patent application No. 3-321353, the latter three materials are electrically insulative and must be removed before the formation of the p-side electrode, so that the productivity is reduced. On the assumption that GaAlN is used for the cap layer, the thermal annealing treatment is performed so that the internal layer is p-typed, a high concentration vacant holes of nitrogen occur in this AlGaN layer. Accordingly, any p+contact layer is not established. In this way, the GaAlN layer must be also removed before the formation of the p-side electrode. Since nitride including GaN is very stable chemically, the chemical etching is not effective to remove such a nitride layer. therefore, the usage of the cap layer is not advantageous in the mass production of the device. The method of (c) utilizes the difference in the elimination rate between hydrogens eliminating from the layer for passivating Mg and nitrogens eliminating from the crystal of matrix nitrides. Therefore, the treating period should be basically set at a compromised elimination rate between the hydrogens and nitrogens. In addition, it is difficult to sharply raise and descend the treating temperature and perform repeatedly such a temperature control in good reproduction.

In the above thermal annealing methods, there occurs commonly readily a mutual diffusion between the internal matrix elements of the device and the acceptor impurities of the growth layer in proportion to the elevation to a high annealing temperature enough to the p-type characteristic establishment. This is problematic in the fabrication of the light emitting diode emitting a short wavelength such as bluish green, blue, ultraviolet or the like, since it necessitates a sharp junction boundary.

SUMMARY OF THE INVENTION

It is therefore an object of the present invention is to provide a process for producing a light emitting diode or a semiconductor laser diode in which the mutual diffusion of the acceptor impurity in the grown layers is suppressed and for establishing the necessary p-type carrier concentration in the emitting device and to provide the device.

A process for producing a semiconductor emitting device of group III nitride semiconductor having a crystal layer $(Al_xGa_{1-x})_{1-y}In_yN$ ($0 \leq x \leq 1$, $0 \leq y \leq 1$) according to the present invention, comprises the steps of;

forming at least one pn-junction or pin-junction and a crystal layer $(Al_xGa_{1-x})_{1-y}In_yN$ ($0 \leq x \leq 1$, $0 \leq y \leq 1$) to which a group II element is added;

forming electrodes on said crystal layer; and heating said pn-junction or pin-junction to the predetermined temperature range while forming and maintaining an electric field across said pn-junction or pin-junction for at least partial time period of the predetermined temperature range via said electrodes.

Namely, a semiconductor emitting device comprising at least one pn-junction or pin-junction between a n-type crystal layer made of a group III nitride semiconductor $(Al_xGa_{1-x})_{1-y}In_yN$ ($0 \leq x \leq 1$, $0 \leq y \leq 1$) and a p-type crystal layer made of a group II element added group III nitride semiconductor and electrodes formed on the crystal layers across the pn-junction or pin-junction in which said pn-junction or pin-junction is heated to the predetermined temperature range while forming and maintaining an electric field across said pn-junction or pin-junction for at least partial time period of the predetermined temperature range via said electrodes whereby the annealing temperature is lowered.

The crystal layer of the group III nitride semiconductor $(Al_xGa_{1-x})_{1-y}In_yN$ ($0 \leq x \leq 1$, $0 \leq y \leq 1$) and pn-junction or pin-junction are formed by using the so-called the metalorganic chemical vapor deposition method. Concrete annealing temperatures as effective for the thermal annealing treatment are described in the above reference thesis (S. Nakamura, T. Mukai, M. Senou and N. Iwasa, Jpn, J. Appl. Phys. d Vol. 31, 1992, pp-L139-L142) e.g., a temperature of 700° C. or less. The present invention is further characterized that the pn-junction or pin-junction is heated by a low temperature 400° .C less than an invalid annealing temperature as described in the Japanese Patent application No. 3-321353 whereby the necessary p-type carrier concentration is established in the emitting device without any mutual diffusion of the acceptor impurities in the grown layers.

The above set forth and other features of the invention will be made more apparent in the ensuing Description of the preferred embodiments when read in conjunction with the attached Drawings.

DESCRIPTION OF THE PREFERRED EMBODIMENTS

The present inventors have completed the present invention based on the results of studies concerning various methods for treating the surface of a group III nitride semiconductor crystal in order to acquire on a sapphire substrate a low-resistivity single crystal of $(Al_xGa_{1-x})_{1-y}In_yN$ with a high emitting property to which an acceptor impurity of group II element such as Mg, Zn or the like is doped, by using a chemical vapor deposition method, particularly a metalorganic compound chemical vapor deposition method (MOCVD) in which metalorganic compound gases e.g., Trimethyl gallium (TMG), Trimethyl Aluminum (TMA) and Trimethyl Indium (TMI) as well as ammonia ($NH_3$) are used so as to meet the atomic ratio x and y of the mixed crystal by controlling the flow of the gases to be provided to the substrate.

A method of forming a light emitting diode with a single homo structure comprising a single crystal of $(Al_xGa_{1-x})_{1-y}In_yN$ ($0 \leq x \leq 1$, $0 \leq y \leq 1$) on a sapphire substrate in accordance with a preferred embodiment of the present invention will be described hereinafter. It is to be noted that the embodiment and examples to be described below simply illustrates the invention, and the invention is not limited thereto. Namely, the invention may be applied to not only the pn-junction-type light emitting diode but also the pin-junction-type emitting device comprising the intrinsic layer disposed between the p-type and the n-type semiconductor layers. FIRST EMBODIMENT (The reverse bias voltage is applied across the electrodes during the thermal annealing treatment.)

Figure 1:
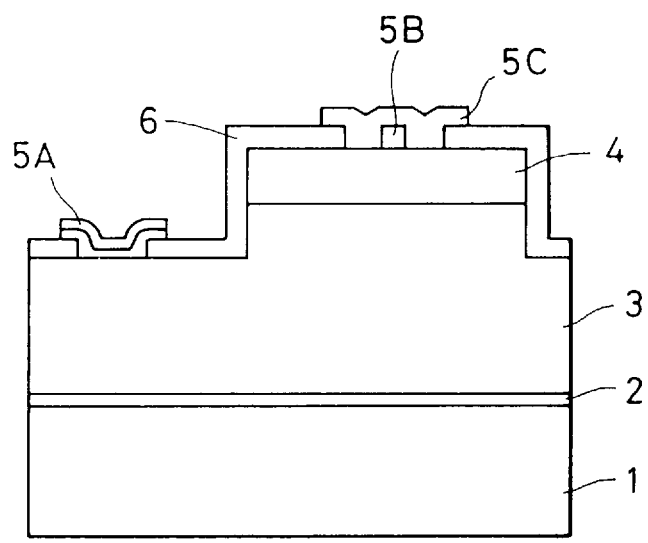
FIG. 1 is a schematic constructive cross-sectional view illustrating a GaN blue light emitting diode of pn-junction-type having a group III nitride semiconductor to which a group II element added manufactured by an embodiment according to the present invention.

A light emitting diode of this embodiment comprises, as shown in FIG. 1, a sapphire substrate 1, a buffer layer 2 of aluminum nitride (AlN), a Si-doped n-type GaN layer 3, a Mg-doped GaN layer 4 and electrodes 5A, 5B, 5C in which a protective layer 6 of silicon dioxide ($SiO_2$) protects the surface over the whole except the electrodes.

(FORMATION OF PN-JUNCTION)

A sapphire wafer for a substrate 1 is introduced into a reactor furnace in which the desired layers are deposited in turn on the substrate by flowing the row material gases. The embodiment employs a metalorganic compound chemical vapor deposition apparatus which is excellent in term of control of film thickness. Since there is a difference of 10% or more in lattice constant between sapphire and a $(Al_xGa_{1-x})_{1-y}In_yN$ ($0 \leq x \leq 1$, $0 \leq y \leq 1$) crystal, an AlN buffer layer 2 is deposit at 50 nm in thickness on the sapphire substrate at a low temperature 600° C. or less and then, a $(Al_xGa_{1-x})_{1-y}In_yN$ ($0 \leq x \leq 1$, $0 \leq y \leq 1$) crystal, for instance a Si-doped n-type GaN layer 3 is epitaxial-grown on the buffer layer 2 to form a low-resistivity epitaxial substrate. The GaN crystal exhibits the n-type conduction property without intentional addition of any impurity and thus it will be usable as it is grown for the n-type layer. In addition, an impurity functioning as donor a such as Si or the like may be added to the layers.

After that, subsequently, the row material gases together with a Mg-organic gas are provided on the Si-doped n-type GaN layer 3 in the reactor furnace so that a Mg-doped p-type GaN layer 4 being different in the conduction property from the layer 3 is grown thereon to form a pn-junction. After the temperature falls, the resultant sapphire wafer substrate carrying the Mg doped GaN layer 4 is taken out of the reactor of the growth apparatus.

(FORMATION OF ELECTRODES)

Next, an etching mask is formed on the Mg doped GaN layer 4 of the wafer by using the photolithography technology and thus unnecessary portions of the Mg doped GaN layer are etched and removed by using the reactive ion etching (RIE) so that some portions of the Si doped n-type GaN layer 3 is exposed outside.

Next, these exposed layers 3 and 4 are coated with a photoresist and then island-masks are formed for contact-holes for electrodes by using the photolithography technology so that other than the masks is removed. Thus, the $SiO_2$ protective layer 6 are deposited of the surface of the substrate by the sputtering method. After that, the photoresist and unnecessary portions of the $SiO_2$ protective layer 6 are partially removed through the lift-off method so as to form contact-holes or electrode passages through which the layers 3 and 4 are partially exposed.

Titanium (Ti) is vapor-deposited on the exposed Si doped n-type GaN layer 3 through the electrode passage at 50 nm by using a pertinent mask, and subsequently Al is similarly vapor-deposited at 200 nm, so that the electrode 5A electrically connected to the layer 3 is formed so as to cover the contact hole.

Palladium (Pd) is vapor-deposited on the exposed Mg doped GaN layer 4 through the electrode passage at 50 nm by using another pertinent mask, so that the island Pd electrode 5B electrically connected to the layer 4 is formed so as to be surrounded the exposed portions of the layer 4 in the contact hole.

(ELECTRIC-FIELD-ASSISTED ANNEALING TREATMENT)

The thermal annealing treatment is performed on the resultant wafer disposed in a heating furnace under nitrogen atmosphere at 1 atms. At the same time, a reverse bias voltage 1.5V of DC current is applied across the electrodes 5A and 5B and, namely, the electrode 5A is in a positive potential in comparison with the electrode 5B. This applied voltage may be preferably set to the range from 1V to 2V as described hereinafter. The resultant wafer is heated and kept under the annealing condition of a temperature ranging from 300° C. to 600° C. for 20 minutes. After the electric field assisted annealing treatment, the wafer is cooled to room temperature and then taken out of the furnace. Next, an Al electrode 5C is vapor-deposited on the Pd electrode 5B of the resultant wafer at 200 nm by using another pertinent mask, so that the electrode 5C electrically connected to the layer 4 is formed so as to cover the contact hole. After the formation of the electrode 5C, the resultant wafer is cut into a plurality of chips of device by a cutting machine such as a dicing machine. The resultant devices are measured in the electric characteristics.

Figure 2:
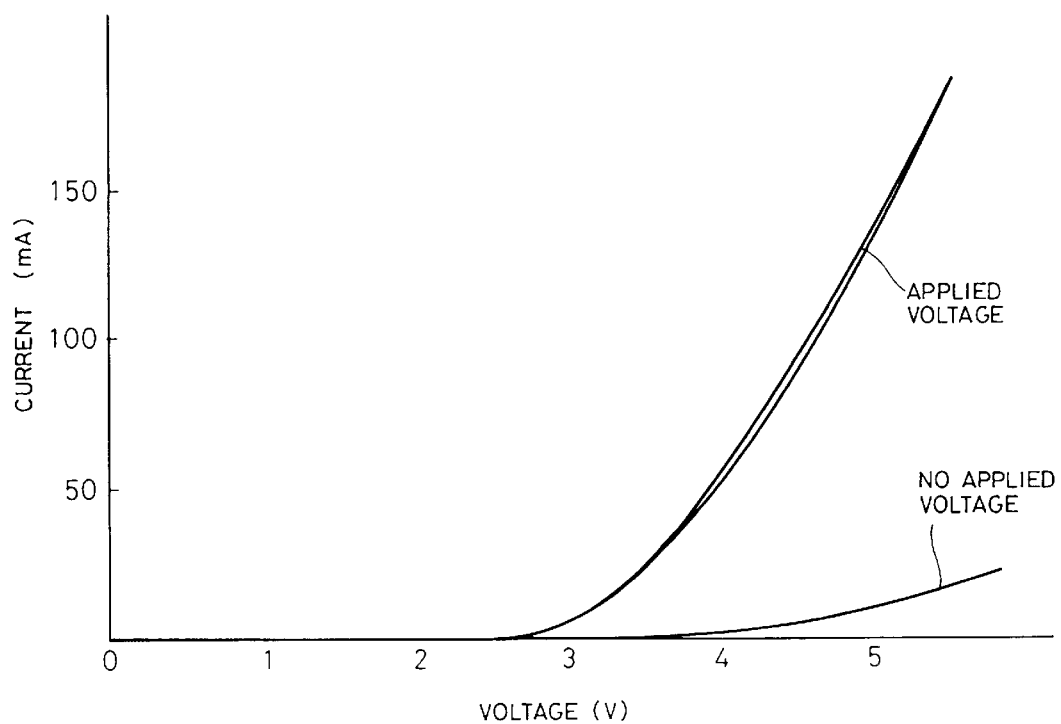
FIG. 2 is a graph showing a current versus voltage characteristics of the light emitting diode of an embodiment according to the invention (under the annealing temperature 600° C. with the voltage application)
Figure 3:
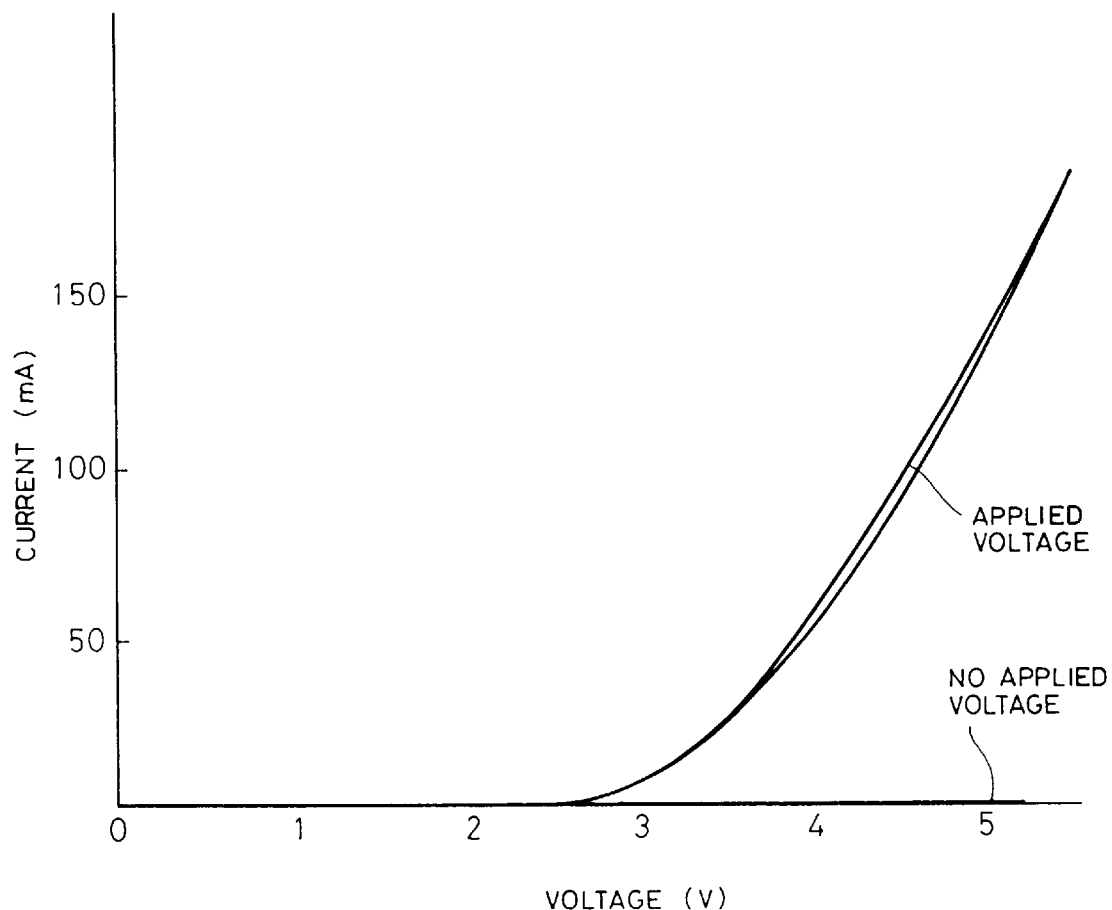
FIG. 3 is a graph showing a current versus voltage characteristics of the light emitting diode of an embodiment according to the invention (under the annealing temperature 300° C. with the voltage application)

FIG. 2 shows a current versus voltage (I–V) characteristics of the resultant light emitting diode device treated under the annealing temperature 600° C. while applying the bias voltage as well as that of a comparative device which is formed in the same manner as the former except that no bias DC voltage is applied across the electrodes. In addition, FIG. 3 shows an I–V characteristics of another device which is formed in the same manner as the former except for the annealing temperature 300° C. as well as that of a comparative device without any applied voltage across the electrodes during the annealing treatment.

Figure 4:
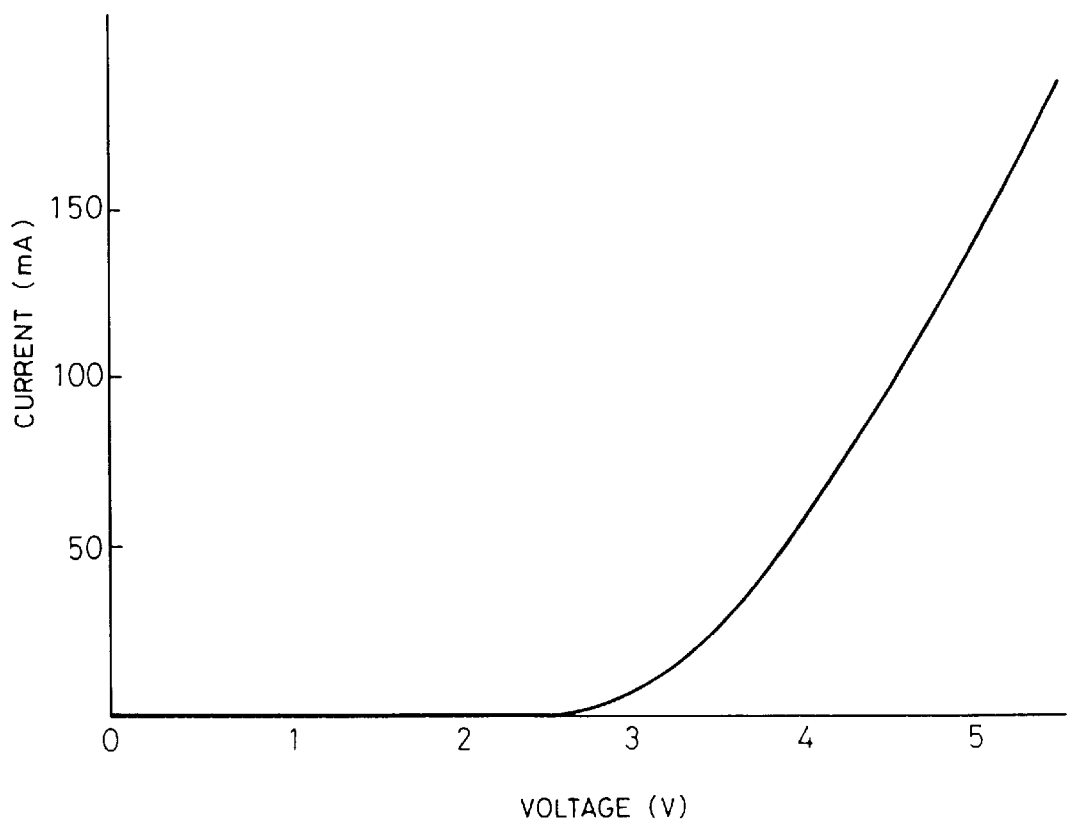
FIG. 4 is a graph showing a current versus voltage characteristics of a comparative light emitting diode (under the annealing temperature 800° C. without any voltage application)

Furthermore FIG. 4 shows a current versus voltage (I–V) characteristics of a comparative light emitting diode device which is formed in the same manner as the forgoing except for the wafer is treated under the thermal annealing condition of 800° C. for 20 minutes after the RIE treatment and then the forgoing electrode 5A is formed and an electrode consisting of Ni at 30 nm and Al at 200 nm vapor deposited on the p-type GaN layer 4. In addition, there is well-known the thermal annealing condition of 800° C. for 20 minutes for sufficiently achieving the p-type establishment only by using such an annealing condition.

In comparison with these characteristics, it can be found that, when applying the DC voltage across the electrodes, the substrate can obtain a low-resistivity property similar to that obtained under the normal annealing of 800° C. even if under a low annealing temperature 300° C. insufficient to achieve the p-type establishment fully. In addition, at whatever temperature of 300° C. or less e.g., room temperature, the p-type may be established, but it is preferably treated at 100° C. or more in practical to homogeneously anneal the substrate otherwise unevenness of treatment occurs.

(MECHANISM OF THE P-TYPE ESTABLISHMENT DUE TO THE LOW-TEMPERATURE ANNEALING PROCESS WHILE APPLYING A REVERSE BIAS ELECTRIC FIELD)

This phenomenon may be explained as follows: In the Mg doped GaN layer grown through the metalorganic chemical vapor deposition method, Mg elements incorporate with atomic hydrogens dissociated from $NH_3$ used as a V-group element and then Mg—H complexes are formed so that the acceptor impurities Mg are neutralized.

(A)

The above (A) represents a situation of a Mg element act as an acceptor in the GaN crystal lattice in which Mg of the group II element having only two electrons in the most outer shell is placed at a lattice point of Ga of the group III so as to act as the acceptor.

(B)

On the other hand, the above (B) represents a situation of a Mg element passivated by hydrogens. The numbers of electrons in the most outer shells of both (A) and (B) situations are compared with each other, the electrons concerning the bondings of peripherals of Mg—N of the centers of the situations. In the situation (A), the number of such electrons is calculated as;

(three N) (Mg) (N) (three Ga)

$3 \times 5/4 + 2 + 5 + 3 \times 3/4 = 13.$

Assuming that Mg is replaced by Ga, namely, there is no impurity in this situation, the total number of the electrons will be 14. The above bonding in the situation (A) is therefore short of one electron. On the basis of this fact, Mg acts as an acceptor.

On the other hand, in the situation (B) the number of such electrons concerning the bondings is similarly calculated as;

(three N) (Mg) (N) (three Ga)

$3 \times 5/4 + 2 + 5 + 1 + 3 \times 3/4 = 14.$

The number of such electrons in the situation (B) is equal to 14 appearing in the case of no impurity. By this, the hydrogen passivates Mg to obstruct the function of acceptor.

There is known that atomic hydrogens make a bond with nitrogens of V-group and that such a bonding energy is much smaller than a bonding energy between elements constructing the matrix semiconductor. Therefore, hydrogens may be dissociated from the Mg acceptor by performing the thermal annealing treatment at a temperature less than the melting point of the matrix semiconductor. The dissociation of such a complex by heating is briefly partially represented as the following formula (1).

The dissociated hydrogens gradually eliminate from the surface of the layer, since the outside of the layer is nitrogen-atmospheric but not hydrogen-atmospheric, so that the hydrogens diffuse from the inside to the outside of the layer in proportion to the gradation slope of hydrogen's concentration. As a result, the concentration of hydrogens decreases in the layer.

The reaction (1) is a reversible reaction and becomes an equilibrium status under a certain condition. The motive power promoting toward the right hand of the reaction (1) is the reduction of the product of the reaction from the left to right hands, namely, the diffusion and elimination of hydrogens from the inside to the outside of the layer. One of the reasons for necessity of a high temperature of the thermal annealing treatment alone for establishing the p-type is that the diffusion of hydrogens of the rate-determining step should be accelerated by the elevation of temperature.

The present invention has been made on the basis of the above discussion while turning the attention to the electric charge of hydrogen resulting from the complex dissociation in which, instead of the alone diffusion caused by the gradation slope of concentration of hydrogen in the layer, electrophoresis caused by the electric field formed in the layer makes the hydrogens transfer outside, so that the treating temperature is reduced and the fast treatment is achieved.

Figure 5:
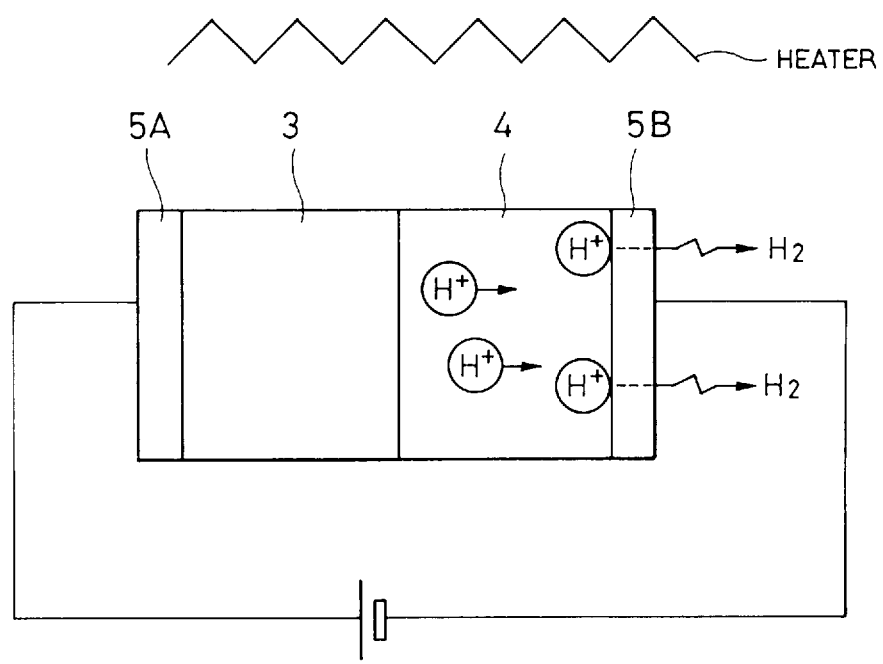
FIG. 5 is a schematic constructive cross-sectional view illustrating the light emitting diode shown in FIG. 1 according to the invention, showing the operation thereof in the treatment.

FIG. 5 shows a light emitting diode precursor of FIG. 1 in the first embodiment above mentioned in which behavior of hydrogens in the layer during the thermal annealing treatment under the application of the reverse bias voltage across the electrodes is illustrated.

Since the atomic hydrogens resulting from the thermal annealing treatment have the positive electric charges, they are forced by the electric field in the Mg doped layer 4 so as to occur the electrophoresis towards the electrode 5B. Since the Mg doped layer 4 is nearly insulative, the reverse bias applied voltage is concentrated to the Mg doped layer. The voltage applied to the Mg doped GaN layer 4 is a little 1.5 V and the thickness of the Mg doped layer in this embodiment is a little 1 micrometers. Therefore the electric field is $1.5 \times 10^4$ kV/cm which is an undue large value. Under such a large electric field, the free hydrogen ions speedily move towards the electrode 5B. When this status is maintained as it is, the hydrogen ions in the electrophoresis crowd around the electrode 5B. Thus, the hydrogen concentration remarkably increases at this portion around the electrode, so that this portion prevents the reaction (1) above mentioned from progress from the left side to right. In other words, the p-type establishment at the portion immediately below the electrode 5B is prevented on the contrary. In case of the present embodiment, the electrode 5B is made of Pd. There is known that the metal Pd has a hydrogen-permeability at a high temperature and usable for the Pd layer in a high accurate hydrogen refinery apparatus. Other metals with a hydrogen-permeability may be used in the invention. The hydrogens ions reached adjacently to the electrode 5B in the electrophoresis obtain electrons from the electrode so as to become $H_2$ which eliminates from the outer surface of the electrode. Here, the hydrogens diffuse in proportion to the gradation slope of concentration thereof alone. Since the large gradation slope of concentration is generated by the applied electric field, a speedy diffusion is carried out. As seem from the mechanism above mentioned, according to the present embodiment, the hydrogen concentration does not increase although such an increase is to occur due to the reaction (1) above mentioned from progress from the left side to right without any electric field applied during the thermal annealing treatment. Further, the hydrogens in electrophoresis escape through the electrode 5B to the outside of the layer, so that the reaction speedily progresses from the left side to right in the reaction.

Figure 6:
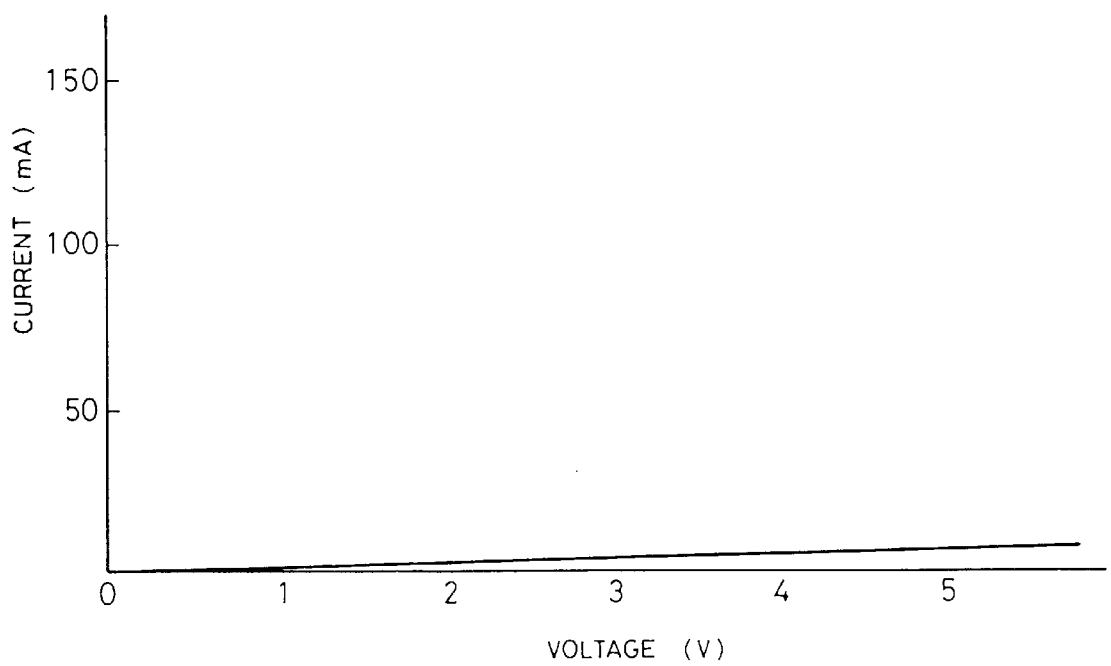
FIG. 6 a graph showing a current versus voltage characteristics of a comparative light emitting diode.

FIG. 6 shows the I–V characteristics of the in the case using an electrode without hydrogen-permeability instead of the electrode 5B. In this case, the diode characteristics does not appear and the electric current hardly flows. This is because as seem from the above description, the elimination of hydrogens outside the layer is prevented due to the existence of the electrode so that the portion immediately below the electrode is not p-typed.

In the case of the device fabricated according to the embodiment, since only the portion immediately below the Pd electrode 5B is p-typed, the incident electric current does not spread in the lateral direction. The metal Pd exhibits a substantially ohmic contact for a high concentration p-type doped GaN. On the other hand, since other than the portion immediately below the Pd electrode 5B remains in a very low concentration of carriers (positive holes) and is hardly insulative at the treating temperature of 300° C., electric current does not flow at the portion surrounding the Pd electrode even though it directly connects to the Al electrode 5C. Therefore, the electric current entering region is restricted within the portion immediately below the Pd electrode 5B. In addition, in the case that the device is treated at the annealing temperature of approximately 400° C., a few portion other than the portion immediately below the electrode 5B is p-typed. Since Al forms the Schottky barrier for the p-type GaN, similarly, the electrode electric current does not flow at the portion surrounding the Pd electrode.

This fact provides a useful application as follows: In the manufacturing the emitting device, the Pd electrodes 5B are formed as a stripe shape on the layer 4 in which each width is set to e.g., approximately 10 micrometers. After that a large area Al electrode 5C is formed on the stripe electrodes. In this case, the value of the incident electric current is determined by the width of the Pd electrode 5B. According to the present embodiment, it is possible to make a narrow structure for concentrating the incident electric current without employing the insulator layer or a reverse connecting pn-embedded structure for defining the electric current entering region in the semiconductor laser device commonly utilized in the art. Therefore, the invention is very useful for the manufacture of the device. SECOND EMBODIMENT (The forward bias vantage is applied across the electrodes during the thermal annealing.)

Figure 7:
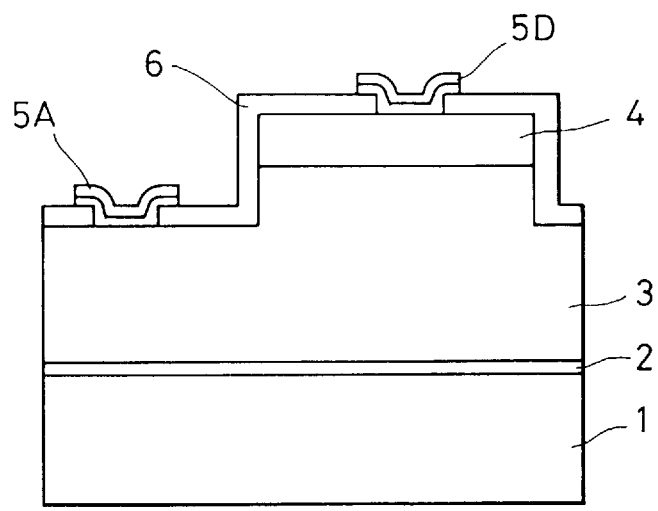
FIG. 7 is a schematic constructive cross-sectional view illustrating a GaN blue light emitting diode of pn-junction-type having a group III nitride semiconductor to which a group II element added manufactured by a second embodiment according to the present invention.

The second embodiment of light emitting diode comprises, as shown in FIG. 7, a sapphire substrate 1, a buffer layer 2 made of AlN, a Si doped n-type layer 3, a Mg doped GaN layer 4 and electrodes 5A, 5D in which a protective layer 6 of $SiO_2$ protects of the surface over the whole except the electrodes.

This embodiment is similar to the first embodiment as far as the pn-junction formation step. In the electrode formation step, the electrode 5A is formed in turn of a Ti layer at 50 nm thick and an Al layer at 200 nm thick on the n-type GaN layer 3 by the vapor-deposition. The electrode 5D formed in turn of a nickel (Ni) layer at 30 nm thick and an Al layer at 200 nm thick on the Mg doped GaN layer 4 by the vapor-deposition.

The annealing treatment with application of an electric field is performed on the resultant wafer disposed in a heating furnace under nitrogen atmosphere at 1 atms. At the same time, the forward bias voltage 5V of DC current is applied across the electrodes 5A and 5D and, namely, the electrode 5D is in a positive potential in comparison with the electrodes 5A. The resultant wafer is heated and kept under the annealing condition of a temperature ranging from 300° C. to 600° C. for 20 minutes. After that it is cooled to room temperature as it is and is taken out of the furnace. Then the resultant wafer is cut into a plurality of chips of device by a cutting machine such as a dicing machine. The resultant devices are measured in the electric characteristics.

Figure 8:
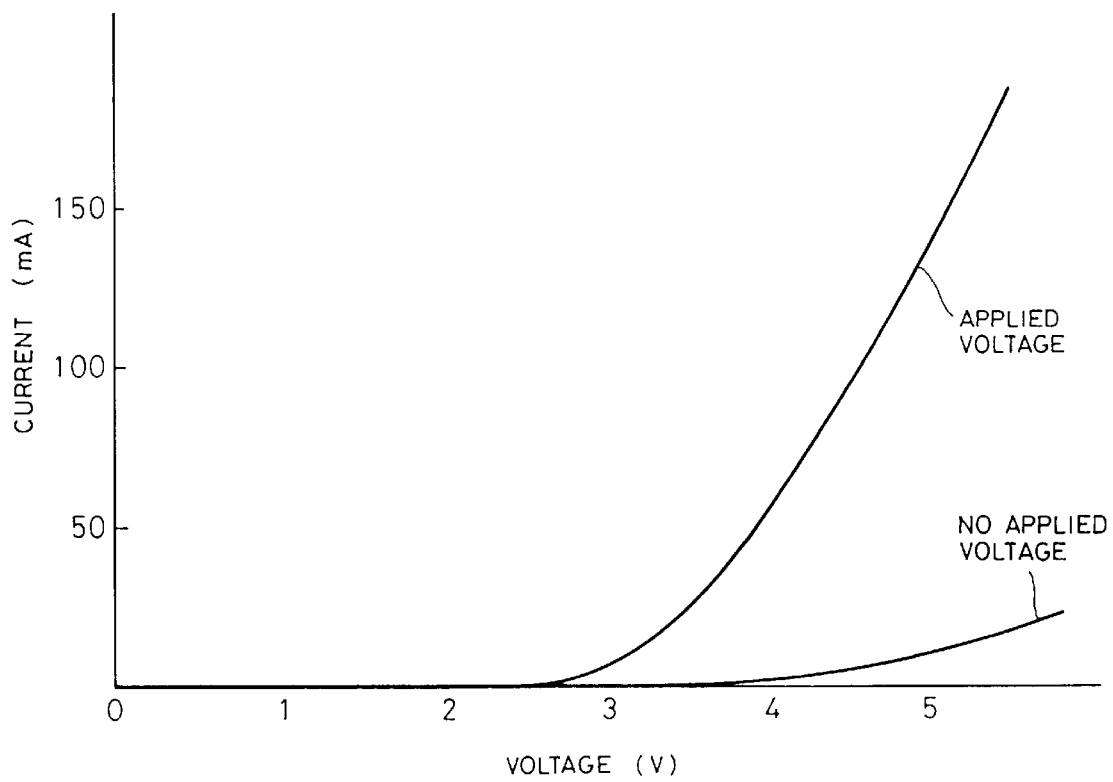
FIG. 8 is a graph showing a current versus voltage characteristics of the light emitting diode of the second embodiment according to the invention (under the annealing temperature 600° C. with the voltage application)
Figure 9:
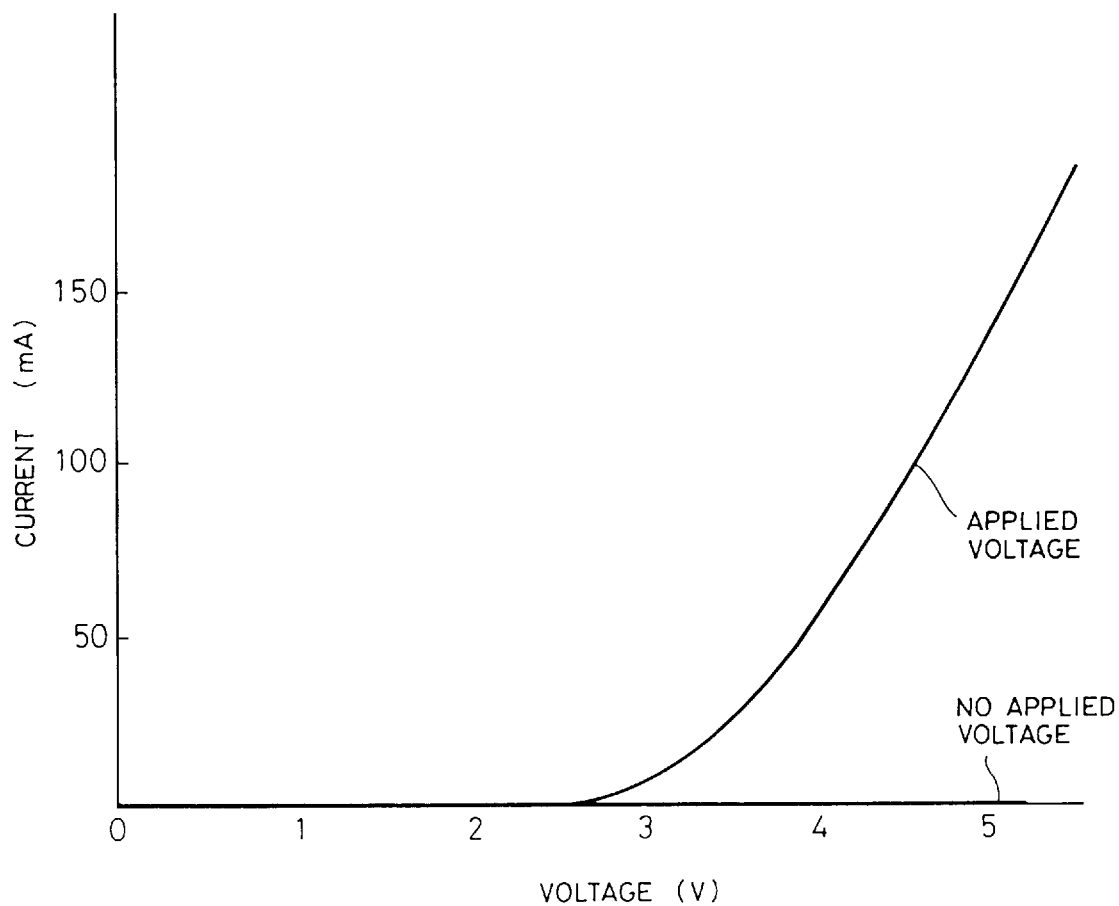
FIG. 9 is a graph showing a current versus voltage characteristics of the light emitting diode of the second embodiment according to the invention (under the annealing temperature 300° C. with the voltage application)

FIG. 8 shows an I–V characteristics of the resultant light emitting diode device treated under the annealing temperature 600° C. while applying the bias voltage as well as that of a comparative device which is formed in the same manner as the former except that no bias DC voltage is applied across the electrodes. In addition, FIG. 9 shows an I–V characteristics of another device which is formed in the same manner as the former except for the annealing temperature 300° C. as well as that of a comparative device without any applied voltage across the electrodes during the annealing treatment.

As these characteristics are compared with that of the comparative light emitting diode of FIG. 4 obtained by the normal 800° C. thermal annealing treatment, it can be found that this embodiment using the low annealing temperature 300° C. and the applying DC voltage across the electrodes achieves the similar characteristics to that of the normal annealing of 800° C.

Figure 10:
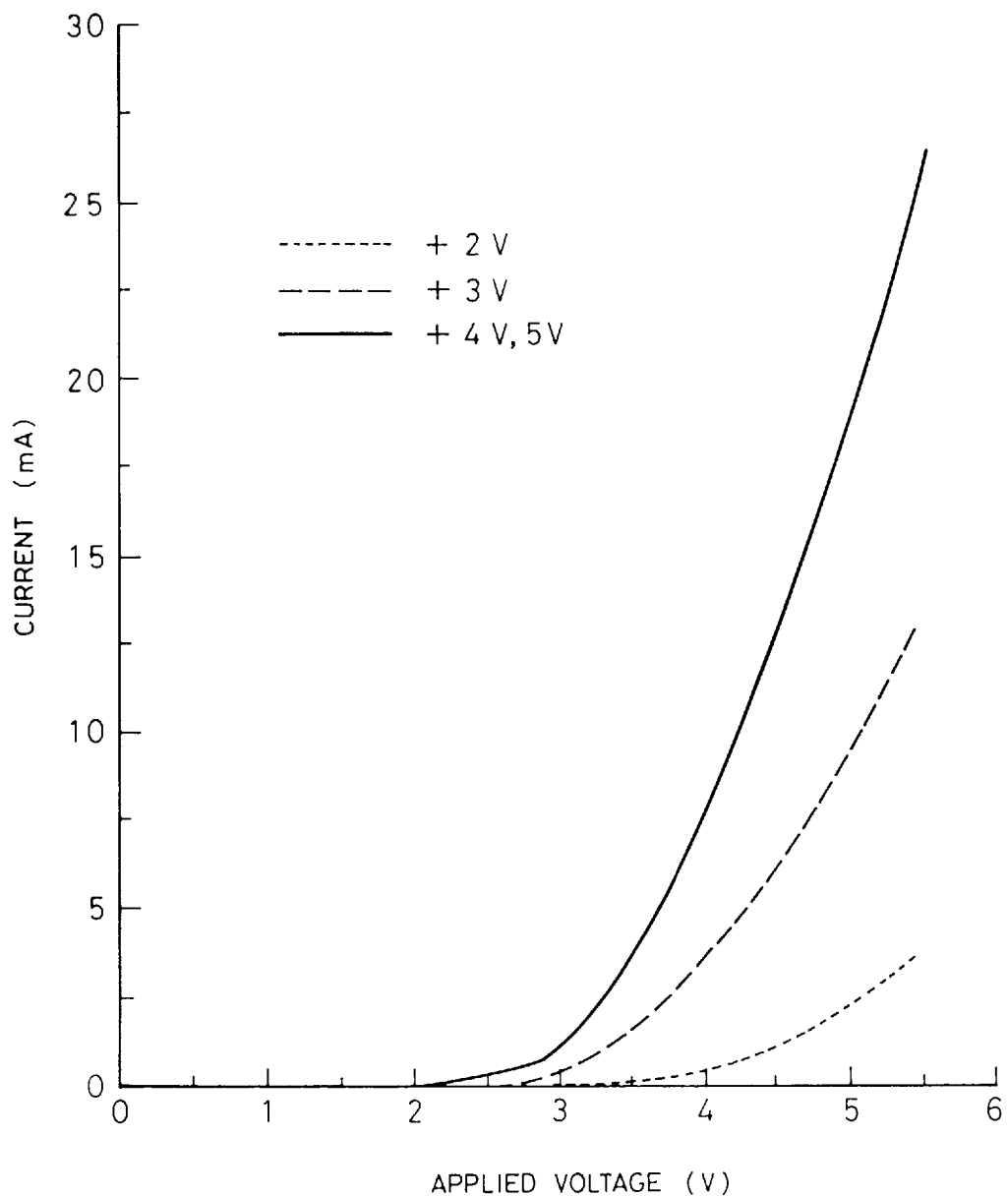
FIG. 10 is a graph showing a current versus voltage characteristics of the light emitting diode of the second embodiment according to the invention (for bias voltages changed from 0 to 4V, 5V during the annealing process).

The I–V characteristics measurements are performed in various voltages applied across the electrodes during the thermal annealing treatments. Typical examples of the I–V characteristics are shown in FIG. 10. As seen from the figure, a sufficient annealing effect does not appear at less than a 1.5V applied voltage. The annealing effect starts to appear at an applied voltage 2V or more and then the full annealing effect appears at more than the diffusion potential.

Figure 11:
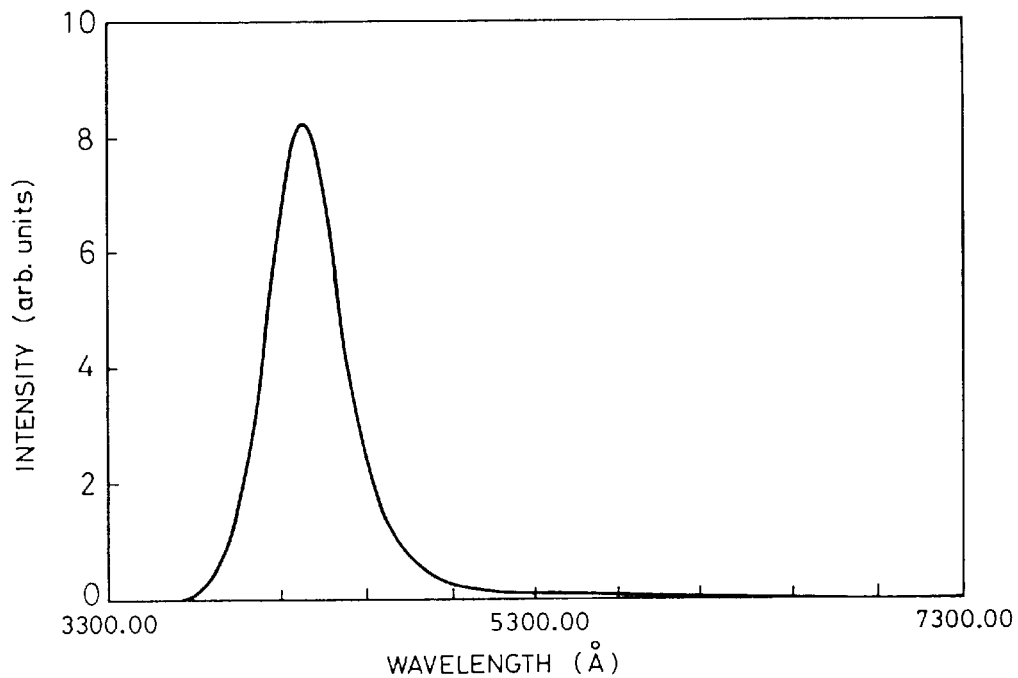
FIG. 11 a graph showing a photoluminescent spectrum of the light emitting diode of FIG. 7.

When an incident electric current is provided in the forward direction to the resultant homo-junction diode of this embodiment at room temperature, the diode emits a bluish violet at a high brightness. This luminance spectrum is shown in FIG. 11 which has a peak at about 410 nm and a half width of approximately 40 nm. In addition, there is no appearance of the so-called defect level emission adjacent to 550 nm which is often observed on the GaN semiconductors. It is found that this embodiment has an excellent emission characteristics as a light emitting diode. Furthermore, although this diode of the embodiment does not have any double hetero structure for confining carriers adjacent to the emitting layer, it emits light with a very high brightness in the kinds of the homo-junction diodes.

(MECHANISM OF THE P-TYPE ESTABLISHMENT DUE TO THE LOW-TEMPERATURE ANNEALING PROCESS WHILE APPLYING A FORWARD BIAS ELECTRIC FIELD)

The mechanism of this embodiment using the electric-field-assisted annealing treatment may be explained. The passivation mechanism of the Mg acceptor impurities in the crystal and the dissociation reaction (1) of Mg-H complex are the same as those of the first embodiment and thus these will not described.

Figure 12:
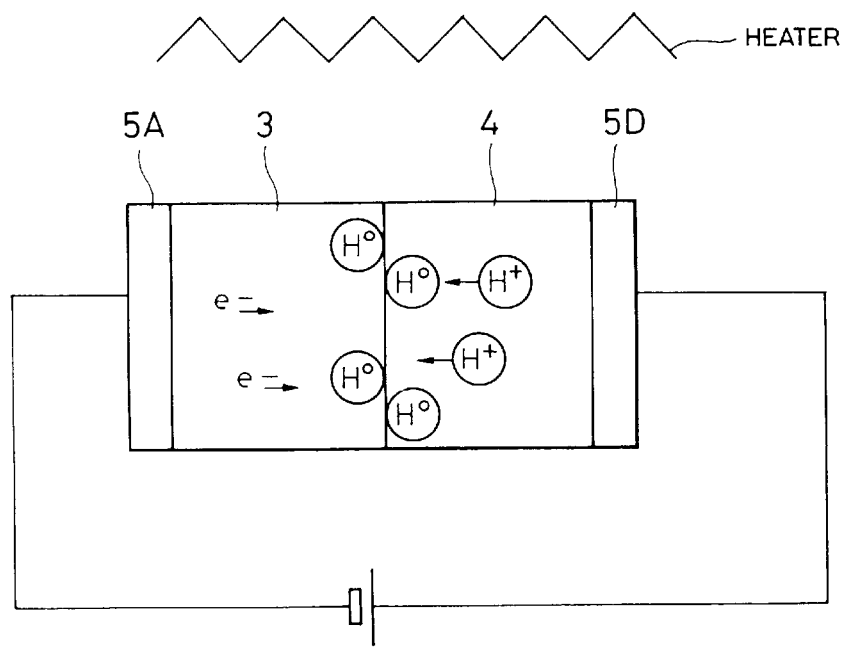
FIG. 12 is a schematic constructive cross-sectional view illustrating the light emitting diode shown in FIG. 1 according to the invention, showing the operation thereof in the treatment.

FIG. 12 shows the light emitting diode precursor of FIG. 7 in the second embodiment in which behavior of hydrogens in the layer during the thermal annealing treatment under the forward bias voltage applied across the electrodes is illustrated.

Since the atomic hydrogens resulting from the thermal annealing treatment have the positive electric charges, they are forced by the electric field in the Mg doped GaN layer 4 so as to occur the electrophoresis towards the n-type GaN layer 3. Since the Mg doped layer 4 is nearly insulative, the forward bias applied voltage is concentrated to the Mg doped layer. The voltage applied to the Mg doped GaN layer 4 is a little 5 V and the thickness thereof in this embodiment is a little 1 micrometers. Therefore the electric field is $5\times10^4$ V/cm which is an undue large value. Under such a large electric field, the free hydrogen ions speedily move towards the n-type GaN layer 3. The hydrogens ions reached adjacent to the boundary of the n-type GaN layer 3 in the electrophoresis obtain electrons from the layer so as to become electrically neutral hydrogens and thus the neutral hydrogens are no longer influenced from the electric field between the electrodes. By this, although the hydrogen concentration adjacent to the pn-junction rises, the neutral hydrogens $H^\circ$ do not promotes the reaction (1) above mentioned from progress from the right side to left, because the neutral hydrogens are different from $H^+$ appearing in the right side of the reaction (1).

Therefore, the plural $H^+$ dissociated from the Mg-complex are removed efficiently, so that the p-type establishment is promoted speedily. The dissociated $H^\circ$ adjacent to the pn-junction do not prevent the p-type establishment.

According to the present embodiment, the hydrogens concentration does not increase although such an increase is to occur due to the reaction (1) from progress from the left side to right without any electric field applied during the thermal annealing treatment. Further, the hydrogen ions in electrophoresis are converted to the neutralized form which does not passivate the Mg-acceptor, so that the reaction speedily progresses from the left side to right in the reaction (1).

(VOLTAGE VALUE FOR THE ELECTRIC-FIELD-ASSISTED ANNEALING TREATMENT)

Next, there will be described a preferable value of applied voltage across the electrode during the annealing treatment in the first and second embodiments.

Figure 13A:
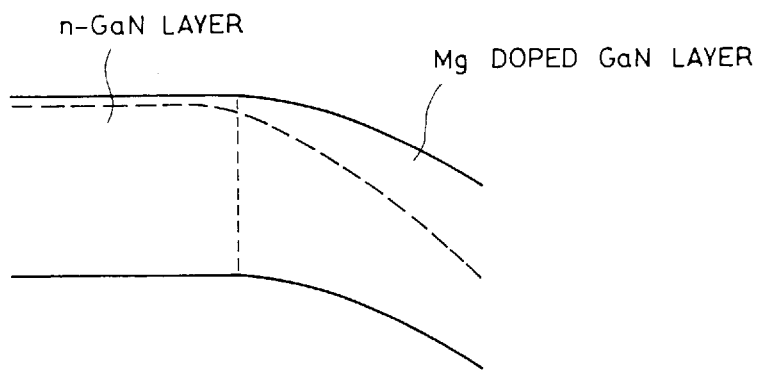
FIGS. 13A–13C show an energy band diagram of a homo-junction device to which a bias voltage more than the diffusion potential is applied in the step for annealing the device while applying an electric field thereto.
Figure 13B:
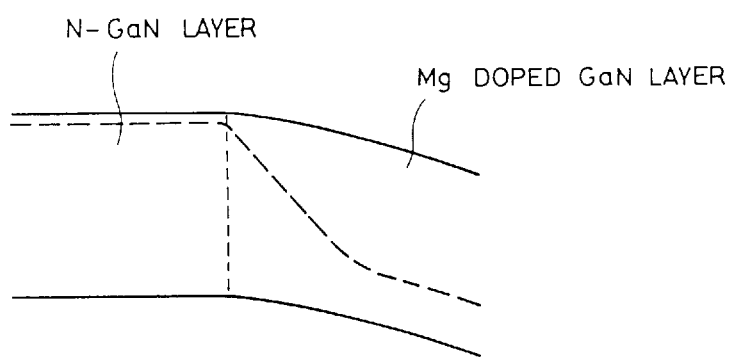
Figure 13C:
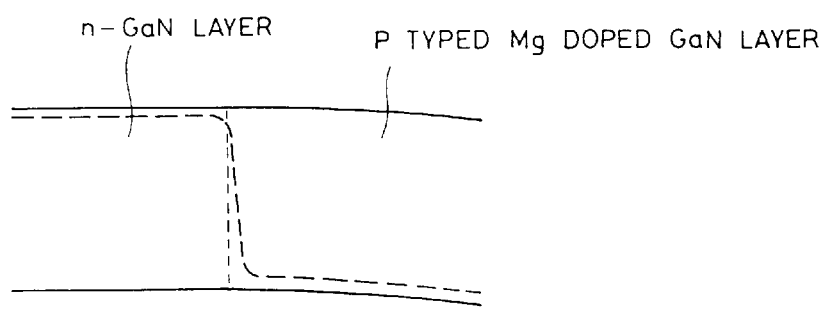

FIGS. 13A to 13C show that the band line rises in the homo-junction device structure during the electric-field-assisted annealing treatment in which the applied voltage across the electrodes is greater than the diffusion potential sufficient to achieve the annealing effect. FIG. 13A shows a status before the annealing treatment and FIG. 13B shows a status during the thermal annealing treatment and further FIG. 13C shows a status after the annealing treatment. In the coordinate of each figure, the horizontal axis denotes the thickness direction and the vertical axis denotes energy of electron. The dotted lines shown in the figures respectively represent the Fermi levels.

In the status before the annealing treatment of FIG. 13A, since the Mg doped GaN layer is a substantially insulator, the applied voltage (5V) is mainly provided to the Mg doped layer. The Fermi level in the n-type the GaN layer is nearly close to the conduction band in response to a high concentration of free electrons. On the other hand, the level in the Mg doped layer is apart from the valence electron band and in intermediate of the band gap in response to an undue low concentration of holes since it is nearly insulative.

On the detail observation on the electric field, there is the largest intensity of the electric field at adjacent to the electrode in the Mg doped layer. As seem from the above description, the portion adjacent to the electrode is p-typed at the very first.

In the status during the annealing treatment of FIG. 13B, since the portion adjacent to the electrode is p-typed, the Fermi level approaches the valence electron band. As approaching, the region influenced by the electric field is gradually restricted to the portion close to the junction boundary.

In the status after the annealing treatment of FIG. 13C, the p-typed portion reaches at the junction boundary in the energy band. Since the electric resistance of the p-type layer is comparatively larger than that of the n-type layer, the electric field is remained in the p-type layer.

Figure 14A:
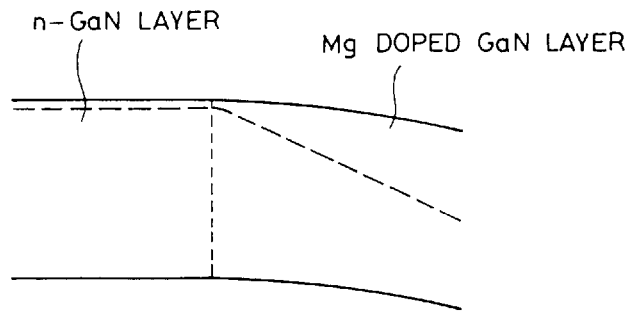
FIGS. 14A–14C show an energy band diagram of a homo-junction device to which a bias voltage less than the diffusion potential is applied in the step for annealing the device while applying an electric field thereto.
Figure 14B:
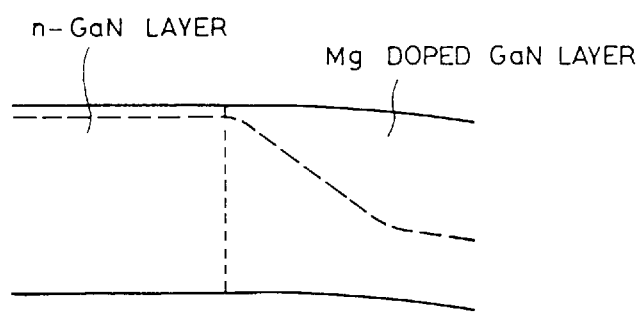
Figure 14C:
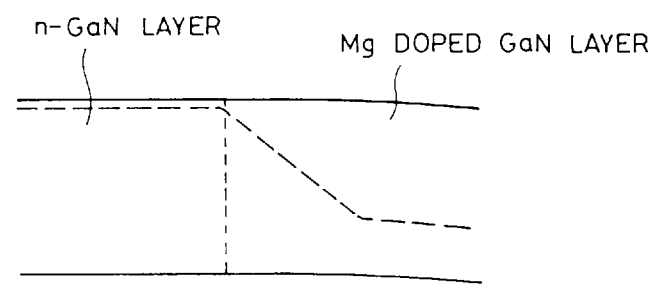

FIG. 14A to 14C show that the band line rises in the homo-junction device structure during the electric-field-assisted annealing treatment in which the applied voltage less than 1.5V is applied across the electrodes that voltage being insufficient to achieve the annealing effect. FIG. 14A shows a status before the annealing treatment and FIG. 14B shows a status during the thermal annealing treatment and further FIG. 14C shows a status after the annealing treatment. In the coordinate of each figure, the horizontal axis denotes the thickness direction and the vertical axis denotes energy of electron. The dotted lines shown in the figures respectively represent the Fermi levels.

In the status before the annealing treatment of FIG. 14A, the Mg doped GaN layer is a substantially insulator and the applied voltage (1.5V) is mainly provided to the Mg doped layer as similarly to FIG. 13A. The Fermi levels shown in dotted line of the n-type GaN layer nearly close to the conduction band in response to a high concentration of free electrons. On the other hand, the level in the Mg doped layer is apart from the valence electron band and in intermediate of the band gap in response to an undue low concentration of holes since it is nearly insulative. On the detail observation on the electric field, there is the largest intensity of the electric field at adjacent to the electrode in the Mg doped layer as similarly to FIG. 13A. As seem from the above description, the portion adjacent to the electrode is p-typed at the very first.

In the status during the annealing treatment of FIG. 14B, since the portion adjacent to the electrode is p-typed, the Fermi level approaches the valence electron band. As approaching, the region influenced by the electric field is gradually moved to the portion close to the junction boundary as similarly to FIG. 13B. As shown in FIG. 14C (after the annealing treatment), however, the electric field gradually weakens during the treatment, so that the electric field effect disappears. This is because, as the p-type establishment progressing, the Fermi level of the Mg doped layer becomes close to the valence electron band as described above, but the applied voltage less than 1.5V is insufficient to achieve the annealing effect.

As described above, the threshold voltage for determining the annealing effect in the electric-field-assisted annealing treatment is nearly equal to the so-called the value of the diffusion potential appearing in the pn-junction is formed after the p-type layer is established.

In the embodiment, since the matrix crystal is GaN, the diffusion potential at room temperature is approximately 3.4V. In case of various emitting devices, for example, a semiconductor laser device employing the hetero structure of $(Al_xGa_{1-x})_{1-y}In_yN$ ($0\leq x\leq 1$, $0\leq y\leq 1$) layers, the smallest value of the diffusion potential at room temperature is 1.9 eV for the InN junction which has the smallest value of the band gap in that crystalline. In fact, in view of a few reduction of the value of the band gap under the thermal annealing treatment temperature, the applied voltage is preferably set to 1.5V or more.

The formation of the crystal layer of $(Al_xGa_{1-x})_{1-y}In_yN$ ($0 \leq x \leq 1$, $0 \leq y \leq 1$) essentially comprising GaN requires the so-called hetero-epitaxial-growth in which the lattice constant of the substrate is different from that of the epitaxial layer since there is not known the crystal substrate with a suitable lattice-match with such a GaN layer. In general, the single crystal sapphire used as the substrate has the lattice constant difference of 10% or more from the crystal $(Al_xGa_{1-x})_{1-y}In_yN$ ($0 \leq x \leq 1$, $0 \leq y \leq 1$). By interposing the low-temperature buffer layer of AlN or GaN between the layer and the substrate, the quality of the crystal layer is improved remarkably. It is not avoidable that the dislocation of approximately $10^8/cm^2$ remains in the comparatively better layer $(Al_xGa_{1-x})_{1-y}In_yN$ ($0 \leq x \leq 1$, $0 \leq y \leq 1$) formed by using the above manners. This $10^8/cm^2$ dislocation concentration is more than four fingers larger in comparison with the value of the dislocation concentration of the optical semiconductor materials such as GaAs which is used so far in general. The dislocations serves as non-radiative recombination centers in the semiconductor crystal to remarkably reduce the emitting characteristic.

In the second embodiment, the hydrogens dissociated from the Mg-H complex make the highest concentration region adjacent to the pn-junction interface by the existence of the electric field effect in the Mg doped layer. Here, the deep-level concerning the dislocation adjacent to the pn-junction or the point-defect in the crystal is passivated. The hydrogen-defect-passivation is well known as the termination of dangling bonds in an amorphous silicon layer. Furthermore, there is a report such that, on the basis of the passivation (neutralization) of the deep-level in the GaAs layer, its photoluminescence (PL) characteristics is improved. There is also a report such that, in GaN as the invention, when the epitaxial layer is exposed under the atomic hydrogens plasma, the emission from the deep-level (about 550 nm emission) disappears. Although such a hydrogens plasma exposure is efficient for the improvement of the emitting characteristic, it passivates the p-type acceptor of Mg and thus it should be applied to the fabrication of the electric current injection type emitting device.

The invention achieves the establishment of the p-type conduction necessary for a high efficient electric current injection by using the electric-field assisted thermal annealing treatment under a low-temperature and furthermore, in the second embodiment of the treating method, the passivation of the defect level in the emission region is performed, so that the short wavelength emitting device with a high brightness is usefully fabricated.

These embodiments, as similar to the first and second embodiments, only the portion immediately below the electrode in the Mg doped layer side is p-typed, so that they is preferably applicable to the semiconductor laser device having a structure confining the incident electric current within a narrow portion.

(VOLTAGE CONTROL DURING THE ELECTRIC-FIELD-ASSISTED ANNEALING TREATMENT)

In each of the embodiments, the constant voltage is applied across the electrodes of the GaN homo-junction pn-type diode precursor during the electric-field-assisted annealing treatment. In the cases of the device structures shown in FIGS. 1 and 7, the electric resistance of the n-type GaN layer can not be ignored. In the second embodiment, in fact, the elevating slope of the I–V characteristics shown in FIG. 9 is determined by the electric resistance of the n-type GaN layer. In other words, the electric current entering the device after the completion of p-type establishment is determined by the electric resistance of the n-type GaN layer. In short, the electric resistance of the n-type GaN layer is a so-call protective electric resistance. The devices of the first and second embodiment have comparatively thin films of n-type GaN layers respectively and thus such a small thickness of the layer has a comparatively large internal series electric resistance in the device. In view of the emitting device in practical, the small value of the internal electric resistance is desirable in the device. On the other hand, in the case that each device of the first and second embodiments is connected to a constant-voltage source to provide a constant voltages thereto, there is an apprehension that deterioration of the device characteristics occurs since a large electric current passes through the device at the completion of the p-type establishment under the annealing temperature condition.

Therefore, the inventors provide that the applied voltage control device controls the applied voltage across the electrodes during the electric-field-assisted annealing treatment to prevent the device characteristics deterioration.

Figure 15:
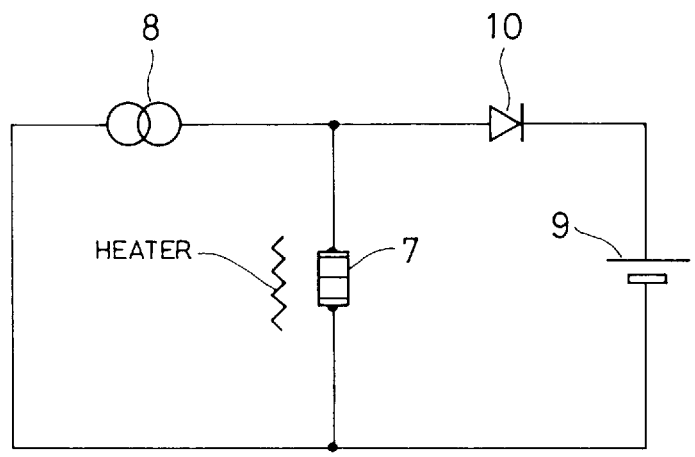
FIG. 15 is a circuit diagram showing an applied voltage control device used in the step for annealing the device while applying an electric field thereto of the embodiment.

FIG. 15 shows an applying-voltage control circuit apparatus as an embodiment in which a constant-current source provides the voltage to be applied across the n-type crystal layer and the electrode of the diode device precursor and a limiter or voltage limiting means is connected in parallel to the diode device precursor to restrict the upper limit of the applied voltage during the electric-field-assisted annealing treatment. As shown in FIG. 15, the applying-voltage control apparatus comprises; a power supply such as a constant-current source 8 for providing a sufficient amount of electric current to generate the hydrogen electrophoresis in the device precursor to be annealed 7; and the voltage limiting means such as a constant-voltage source 9 and a backflow-preventing diode 10 which restrict the upper limit of the applied voltage across the n-type crystal layer and the electrode in the device precursor to be annealed 7.

Before the beginning of the thermal annealing treatment, the device precursor 7 is substantially electrically insulative and thus the internal power supply within the constant-current source 8 feeds the current to the device precursor 7 as far as the upper limit allows so that the voltage across both ends of the device precursor rises. On the other hand, since the constant-voltage source 9 with the predetermined output voltage Vt and the backflow-preventing diode 10 are connected in parallel to the device precursor 7, the value of the voltage applied to the device precursor 7 is restricted. For example, when a Si diode is used for the diode 10, the upper limit value is approximately 0.6+Vt (Volt).

In progress of the annealing treatment to the p-type establishment, the internal electric resistance of the device precursor goes down and then the electric current passing through the device precursor 7 gradually increases, but soon is restricted by the upper limit value of the constant-electric current.

Figure 16:
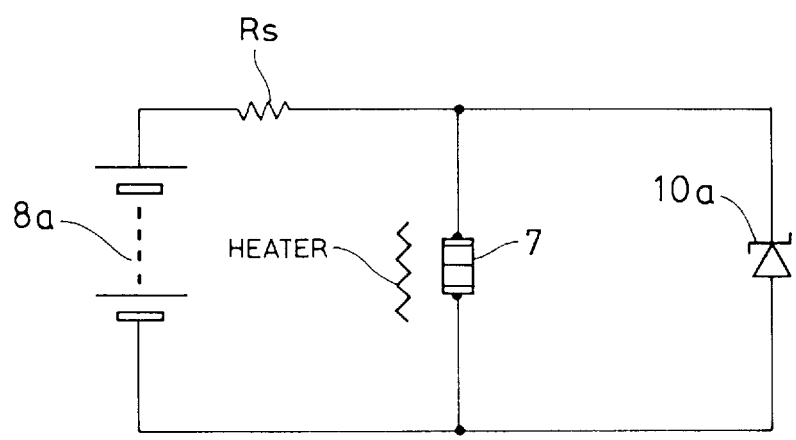
FIG. 16 is a circuit diagram showing an applied voltage control device used in the step for annealing the device while applying an electric field thereto of another embodiment.

FIG. 16 shows another applying-voltage control circuit apparatus used in the electric-field-assisted annealing treatment. This applying-voltage control apparatus comprises; a power supply such as a high voltage supply 8a for providing a sufficient amount of electric current to generate the hydrogen electrophoresis in the device precursor to be annealed 7; and the voltage limiting means such as a high resistance resistor Rs and the Zener diode 10a which restrict the upper limit of the applied voltage across the n-type crystal layer and the electrode in the device precursor to be annealed 7, instead of the constant-current source 8 and the constant-voltage source 9 and the backflow-preventing diode 10 respectively in the above control apparatus. The Zener diode 10a is connected in parallel to the device precursor 7 for determining the largest voltage applied to the latter. The high resistance resistor Rs is connected in series to the device precursor 7 and has a value of electric resistance much greater than the value of series electric resistance of the device precursor. The high voltage source 8a has a pertinent voltage enough to supply the sufficient electric current to the device precursor 7 and the high resistance resistor Rs.

This embodiment is no problem in practice, even though the constant-electric current characteristics or the voltage limiting characteristics is perfect.

In addition, the further another embodiment of the applying-voltage control apparatus includes a superposing circuit for superposing the AC current onto the DC current supplied from the constant-current source 8 of the applying-voltage control apparatus shown in FIG. 15 during the electric-field-assisted annealing treatment.

Figure 17:
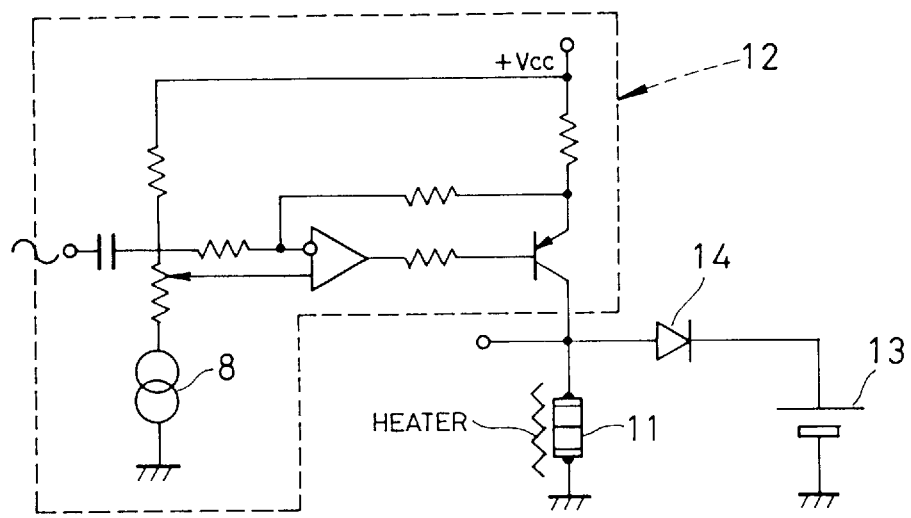
FIG. 17 is a circuit diagram showing an applied voltage control device used in the step for annealing the device while applying an electric field thereto of a further another embodiment.

FIG. 17 shows a sample of such an embodiment of a superposing circuit comprising a voltage applying power supply 12 for superposing the AC current onto the DC current is added to the applying-voltage control circuit apparatus.

In this embodiment, the voltage-applying power supply 12 superposes the AC component 8a onto the DC current component supplied from the constant-current source 8 to provide the resultant superposed current to the device precursor 11. Before the beginning of the thermal annealing treatment, since the device precursor 11 is substantially electrically insulative, the superposed current supplied from the voltage-applying power supply 12 including the constant-current source 8 flows to a backflow-preventing diode 14 and a constant-voltage source 13 (the predetermined voltage value is Vt) while the supply applying the superposed current across both ends of the device precursor 11. For example, when a Is diode is used for the diode 14, the upper limit value is approximately 0.6+Vt (Volt). In progress of the annealing treatment to the p-type establishment, the internal electric resistance of the device precursor 11 goes down. On the other hand, since the constant-voltage source 9 with the predetermined output voltage Vt and the backflow-preventing diode 10 are connected in parallel to the device precursor 7, the value of the voltage applied to the device precursor 7 is restricted. At this time, since the value of the AC voltage appearing across both ends of the device precursor 11 is the product both of the amplitude value of the AC component and the value of series electric resistance, the measurement of the AC voltage across both ends of the device precursor 11 enables to observe the status in progress of the device precursor 11.

As described above, the invention provides a process for producing a semiconductor emitting device of IGgroup III nitride semiconductor having a crystal layer $(Al_xGa_{1-x})_{1-y}In_yN$ ($0 \leq x \leq 1$, $0 \leq y \leq 1$) including; the step of forming at least one pn-junction or pin-junction and a crystal layer $(Al_xGa_{1-x})_{1-y}In_yN$ ($0x \leq 1$, $0 \leq y \leq 1$) to which a group II element is added; and the step of forming electrodes on said crystal layer; characterized by the process further including an electric-field-assisted annealing treatment in which said pn-junction or pin-junction is heated to the predetermined temperature range while forming and maintaining an electric field across said pn-junction or pin-junction for at least partial time period of the predetermined temperature range via said electrode. Therefore the invention suppresses the mutual diffusion of the acceptor impurity in the grown layers to efficiently establish the necessary p-type carrier concentration in the emitting device and further enables to fabricate the luminous device of group III nitride semiconductor such as the light emitting diode or the semiconductor laser which emits a short wavelength such as bluish green, blue, ultraviolet or the like.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

What is claimed is:

1. A process for producing a semiconductor emitting device of group III nitride semiconductor having a substrate, comprising the steps of:

forming an n-type crystal layer of $(Al_xGa_{1-x})_{1-y}In_yN$ ($0 \leq x \leq 1$, $0 \leq y \leq 1$) and a p-type crystal layer of $(Al_xG_{1-x})_{1-y}In_yN$ ($0 \leq x \leq 1$, $0 \leq y \leq 1$) having an added group II element over said substrate to form at least one pn-junction or pin-junction;

forming electrodes on said crystal layers; and heating said pn-junction or pin-junction to a temperature range of room temperature or more while forming, supplying and maintaining an electric field across said pn-junction or pin-junction during maintenance of said temperature range via said electrodes.

2. A process according to claim 1, wherein said junction forming step includes a metalorganic chemical vapor deposition method in which by using one set of metalorganic compound gases, an n-type crystal layer of group III nitride semiconductor $(Al_xGa_{1-x})_{1-y}In_yN$ ($0 \leq x \leq 1$, $0 \leq y \leq 1$) is formed over said substrate and then a p-type crystal layer of group III nitride semiconductor $(Al_xGa_{1-x})_{1-y}In_yN$ ($0 \leq x \leq 1$, $0 \leq y \leq 1$) is formed on said n-type crystal layer.

3. A process according to claim 2, wherein said heating step is performed at said temperature range ranging from 100° C. to 600° C.

4. A process according to claim 2, wherein at least one of said electrodes is formed of a hydrogen-permeable metal having a hydrogen-permeability at said temperature range, and then said electric field is formed by applying a voltage across said n-type crystal layer and said electrodes in a reverse bias for the pn-junction or pin-junction in said heating step.

5. A process according to claim 2, wherein said electric field is formed by applying a voltage across said n-type crystal layer and said electrodes in a forward bias for the pn-junction or pin-junction in said heating step.

6. A process according to claim 5, wherein said applied voltage is 1.5V or more.

7. A process according to claim 5, wherein, in said heating step, said voltage across said n-type crystal layer and said electrodes is supplied from a constant-current source, and said n-type crystal layer and said electrodes are connected in parallel to voltage limiting means for restricting an upper limit of said applied voltage.

8. A process according to claim 7, further comprising a step of superposing an AC current to electric current supplied from said constant-current source.

9. A process according to claim 3, wherein at least one of said electrodes is formed of a hydrogen-permeable metal having a hydrogen-permeability at said temperature range, and then said electric field is formed by applying a voltage across said n-type crystal layer and said electrodes in a reverse bias for the pn-junction or pin-junction in said heating step.

10. A process according to claim 3, wherein said electric field is formed by applying a voltage across said n-type crystal layer and said electrodes in a forward bias for the pn-junction or pin-junction in said heating step.

11. A process according to claim 10, wherein said applied voltage is 1.5V or more.

12. A process according to claim 10, wherein, in said heating step, said voltage across said n-type crystal layer and said electrodes is supplied from a constant-current source, and said n-type crystal layer and said electrodes are connected in parallel to voltage limiting means for restricting an upper limit of said applied voltage.

13. A process according to claim 12, further comprising a step of superposing an AC current to electric current supplied from said constant-current source.

* * * * *

UNITED STATES PATENT AND TRADEMARK OFFICE
CERTIFICATE OF CORRECTION

PATENT NO. : 5,834,326
DATED : November 10, 1998
INVENTOR(S) : MIYACHI et al.

It is certified that error appears in the above-identified patent and that said Letters Patent is hereby corrected as shown below:

Title Page, Item [75], in the Inventors, line 5, "Trusugashima" should read --Tsurugashima--.

Signed and Sealed this

Eighteenth Day of July, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO.: 5,834,326

DATED: November 10, 1998

INVENTOR(S): MIYACHI et al.

It is certified that an error appears in the above-identified patent and that said Letters Patent is hereby corrected as shown below:

Claim 1, column 16, lines 16-17, "$(Al_xG_{1-x})_{1-y}In_yN$" should read --$(Al_xGa_{1-x})_{1-y}In_yN$--.

Signed and Sealed this

Fifteenth Day of August, 2000

Attest:

*Attesting Officer*

Q. TODD DICKINSON

*Director of Patents and Trademarks*